United States Patent [19]

Polichette et al.

[11] 3,772,056

[45] Nov. 13, 1973

[54] SENSITIZED SUBSTRATES FOR CHEMICAL METALLIZATION

[75] Inventors: Joseph Polichette, South Farmingdale; Edward J. Leech, Oyster Bay; Francis J. Nuzzi, Lynbrook, all of N.Y.

[73] Assignee: Photocircuits Division of Kollmorgen Corporation, Hartford, Conn.

[22] Filed: July 29, 1971

[21] Appl. No.: 167,432

[52] U.S. Cl. .............. 117/47 A, 117/227, 117/93.3, 117/130 E, 117/160 R

[51] Int. Cl. .............................................. B44d 1/02

[58] Field of Search ................... 117/212, 227, 93.3, 117/47 A, 130 E, 100 R

[56] References Cited

UNITED STATES PATENTS

| | | | |
|---|---|---|---|
| 3,562,005 | 2/1971 | De Angelo et al. | 117/93.3 X |
| 3,650,911 | 3/1972 | Lin | 117/47 A |
| 3,560,257 | 2/1971 | Schneble et al. | 117/212 |
| 3,492,151 | 1/1970 | Cescon | 117/93.3 X |
| 3,658,569 | 4/1972 | Phillipp et al. | 117/93.3 X |
| 3,451,813 | 6/1969 | Kinney et al. | 117/93.3 X |

*Primary Examiner*—Edward G. Whitby
*Attorney*—George B. Finnegan, Jr.

[57] ABSTRACT

There are provided new articles of manufacture, suitable for the production of metallized bodies, such as printed circuits, dials, nameplates, metallized plastics, glass, ceramics and the like, comprising bases coated with a layer of copper, nickel, cobalt or iron salts or salt compositions, which on exposure to radiant energy, such as heat, light, etc., or chemical reducing agents is converted to a layer of metal nuclei which is non-conductive, but which is capable of catalyzing the deposition of metal onto the base from an electroless metal deposition solution in contact with the metal nuclei.

32 Claims, No Drawings

SENSITIZED SUBSTRATES FOR CHEMICAL METALLIZATION

This invention relates to novel and improved methods for metallizing bodies, e.g., insulating supports, and to the products which result from such methods.

More particularly, the present invention relates to imposing, by thermal, radiant energy or chemical reduction methods, sensitive non-conductive metallic areas on the surfaces of such bodies which catalyze the deposition of strongly adherent and rugged deposits of electroless metal.

Although applicable whenever it is desired to apply a metallic coating to a base, as for example, for decorative or protective effects, or to make electrical conductors of a wide variety of shapes and configurations, the procedures for metallization herein are particularly useful for making printed circuits from readily available base materials, e.g., metal clad laminates, resinous insulating laminated bases or porous non-conductive materials, e.g., fiberglass, paper, cloth, cardboard, ceramics and the like.

It is a primary object of this invention to provide bases sensitive to metallization by electroless plating and, optionally, subsequent electroplated metal deposition.

Another principal object of this invention is to provide improvements in metallization processes in which a base is sensitized to metallization by electroless plating.

An additional object of this invention is to provide base materials and processes for electroless metallization in which there are employed non-noble metal sensitizers which are much more economical in cost, but equivalent in performance to the noble metal-containing sensitizers used until now.

Another object of this invention is to provide adherent electroless metal coatings directly bonded to base materials either directly or through an intermediate, adhesive layer.

Although the invention will be described with particular reference to printed circuits, and although fabrication of printed circuits constitutes a primary and preferred application, it should be understood that the invention is not limited to printed circuits but is applicable to metallizing surfaces broadly.

Heretofore, it has been known to employ a number of pretreatment or sensitization baths in effecting the electroless deposition of metals on various surfaces. All such prior art sensitization baths used commercially have been expensive because they depend upon a noble metal, e.g., palladium, platinum, gold, silver, etc., as the sensitizing component. In spite of the expense, however, the prior art has stood fast in its feeling that precious metals must be used if sensitization to electroless metal deposition and good bond strength between the sensitized surface and the electroless deposit is to be achieved. In one embodiment, such prior art nobel metal sensitization baths are used sequentially by providing first a film of a Group IV metal ion, e.g., stannous ion, and then a film of reduced precious metal, e.g., reduced palladium, on the surface. In another embodiment, unitary noble metal baths are used, from which there is deposited on the surface a film of colloidal noble metal or a complex of noble metal which is later reduced.

It has now been discovered that adherent electroless metal deposits can be applied to a broad variety of insulating substrates without the need to use expensive noble metals.

In addition, the methods of this invention avoid the flash deposition of precious metals which sometimes causes loss of bond strengths between the electroless metal and the base in prior art procedures.

When following the teachings herein, there can be obtained printed circuits of the highest quality using base metals only in all steps of their production.

DESCRIPTION OF THE INVENTION

According to the present invention there are provided new articles of manufacture comprising a base and a layer on the base, the layer comprising a metal salt or metal salt composition which on exposure to radiant energy, such as heat, light, electron beams, X-rays, etc., or to a chemical reducing agent is converted to a layer of metal nuclei which is non-conductive and which is capable of catalyzing the deposition of electroless metal from an electroless metal deposition solution in contact with the base, the metal salt being selected from salts of copper, nickel, cobalt, iron or mixtures of any of the foregoing.

According to the present invention there is also provided in a process for producing metallized articles by contacting a base sensitized to the reception of electroless metal with an electroless metal deposition solution, an improvement which comprises providing the base with a layer of a metal salt or metal salt composition which on exposure to radiant energy, such as heat, light, electron beams, X-rays, etc., or to a chemical reducing agent is convertible to a non-conductive layer of metallic nuclei and exposing the layer to a suitable source of radiant energy or to a chemical reducing agent, so as to convert it to a non-conducting layer of metal nuclei which are catalytic to the reception of electroless metal, said metal salt being selected from salts of copper, nickel, cobalt, iron or mixtures of any of the foregoing.

In carrying out the present invention, the base is cleaned, if necessary, then coated with the metal salt, e.g., by dip-coating in a solution of the salt, on areas on which it is desired to deposit metal electrolessly. When it is desired to metallize only selected areas of the surface of a body and/or only selected interior portions thereof, e.g., hole walls, suitable masking may be used to protect the areas which are to be free of the metal deposit during as well as after the coating and reduction.

Among the materials which may be used as bases in this invention are inorganic and organic substances, such as glass, ceramics, porcelain, resins, paper, cloth, and the like. Metal-clad or unclad substances of the type described may be used.

For printed circuits, among the materials which may be used as the bases, may be mentioned metal clad or unclad insulating thermosetting resins, thermoplastic resins and mixtures of the foregoing, including fiber, e.g., fiberglass, impregnated embodiments of the foregoing.

Included in the thermoplastic resins are acetal resins; acrylics, such as methyl acrylate, cellulosic resins, such as ethyl cellulose, cellulose acetate, cellulose propionate, cellulose acetate butyrate, cellulose nitrate, and the like; polyethers; nylon; polyethylene; polystyrene; styrene blends, such as acrylonitrile styrene and copolymers and acrylonitrile-butadiene styrene copolymers; polycarbonates; polychlorotrifluoroethylene; and vinyl polymers and co-polymers, such as vinyl acetate, vinyl alcohol, vinyl butyral, vinyl chloride, vinyl chloride-acetate co-polymer, vinylidene chloride and vinyl formal.

Among the thermosetting resins may be mentioned allyl phthalate; furane, melamine-formaldehyde; phenol formaldehyde and phenolfurfural co-polymers, alone or compounded with butadiene acrylonitrile co-polymers or acrylonitrile-butadiene-styrene co-polymers; polyacrylic esters; silicones; urea formaldehydes; epoxy resins; allyl resins; glyceryl phthalates; polyesters; and the like.

Porous materials, comprising paper, wood, Fiberglas, cloth and fibers, such as natural and synthetic fibers, e.g., cotton fibers, polyester fibers, and the like, as well as such materials themselves, may also be metallized in accordance with the teachings herein. The invention is particularly applicable to the metallization of resin impregnated fibrous structures and varnish coated resin impregnated fiber structures of the type described.

The bases coated with catalytic metal nuclei generically will include any insulating material so-coated regardless of shape or thickness, and includes thin films and strips as well as thick substrata. An adhesive layer can be on the base, beneath the metal nuclei.

The bases referred to herein are inorganic or organic materials of the type described which have surface layer comprising metallic nuclei which are catalytic to the reception of electroless metal, "catalytic" in this sense referring to an agent which is capable of reducing the metal ions in an electroless metal deposition solution to metal.

The catalytic metals for use herein are selected from Period 4 of Groups VIII and IB of the Period Table of the Elements: iron, cobalt, nickel and copper. Particularly preferred is copper.

The catalytic metal, for example in the form of a solution of the reducible salt or reducible salt composition is applied to the base and then reduced on the surface of the base by application of radiant energy, e.g., heat, light, such as ultra-violet light, electron beams, X-ray and the like, or by treatment with a chemical reducing agent. If multivalent, the reducible salt can be in any oxidation state, e.g., both, cuprous and cupric, ferrous and ferric, ions may be used.

In one manner of proceeding, a solution of a heat-reducible metal salt, e.g., cupric formate, and optionally a developer, e.g., glycerine, and a surfactant, in a solvent, such as water, is dip-coated onto the base, dried and heated, e.g., at 100° to 170°C., preferably at 130° to 140°C., until the coating has darkened in color, indicating the metallic salt has been reduced to a non-conductive layer of copper nuclei. The base is now catalytic to the deposition of electroless metal on the surface of the base and on the walls in any holes in the base.

In more detail, according to such a heat-activation process, the base, if necessary, is cleaned and pretreated by one of the methods to be described. The clean base is dip coated in one of the metal salt solutions, to be described in detail hereinafter, for a short time, e.g., 1-3 minutes. The coated base is then placed in a heated area, e.g., an oven for 10 to 20 minutes, or until the metal salt is reduced to metallic nuclei. The temperature of heating can range from 100° to 170°C., but the preferred range is 130°-140°C. The reduction is considered complete when the coating has darkened in color. The base is then removed from the heated area and allowed to cool. The coating is now catalytic to electroless metal deposition and can be processed in known ways, as will be described hereinafter, for the subsequent build-up of electroless metal plating and, optionally, a top layer of electroplating.

In another manner of proceeding, a solution of a metal salt composition, e.g., cupric formate, and a light-sensitive reducing agent, a second reducing agent, and optionally (for hard to wet surfaces) a surfactant, in water or an organic solvent, such as an alcohol, dimethyl formamide, dimethyl sulfoxide, and the like, is coated on the base, dried and exposed to ultraviolet light radiation to form a non-conductive layer of metallic nuclei. Suitable ligh-sensitive reducing agents are aromatic diazo compounds, ferric salts, e.g., ferric oxalate, ferric ammonium sulfate, dichromates, e.g., ammonium dichromate, anthraquinone disulfonic acids or salts thereof, glycine (especially active under humid surface conditions), L-ascorbic acid, azide compounds, and the like, as well as metal accelerators, e.g., tin compounds, e.g., stannous chloride or compounds of silver, palladium, gold, mercury, cobalt, nickel, zinc, iron, etc., the latter group optionally being added in amounts of 1 mg to 2 grams per liter.

Among the second reducers are polyhydroxy alcohols, such as glycerol, ethylene glycol, pentaerythritol, mesoerythritol, 1,3-propanediol, sorbitol, mannitol, propylene glycol, 1,2-butane-diol, pinacol, sucrose, dextrin, and compounds such as triethanolamine, propylene oxide, polyethylene glycols, lactose, starch, ethylene oxide and gelatin. Compounds which are also useful as secondary reducers are aldehydes, such as formaldehyde, benzaldehyde, acetaldehyde, n-butyraldehyde, polyamides, such as nylon, albumin and gelatin; leuco bases of triphenyl methane dyes, such as 4-dimethylamino triphenylmethane, 4,4',4''-tris-dimethylaminotriphenylmethane; leuco bases of xanthene dyes, such as 3,6-bis dimethylamino xanthene and 3,6-bis dimethylamino-9-(2-carboxyethyl)xanthene; polyethers, such as ethylene glycol diethyl ether, diethylene glycol diethyl ether, tetraethylene glycol dimethyl ether, and the like. Among the suitable surfactants are polyethenoxy nonionic ethers, such as Triton X-100, manufactured by Rohm & Haas Co., and nonionic surfactants based on the reaction between nonyl phenol and glycidol, such as Surfactants 6G and 10G manufactured by Olin Mathieson Company.

After exposure to ultraviolet light radiation for a short time the reduction to metallic nuclei is generally complete. If desired, the reduction can be further enhanced by heating at temperatures of up to about 130° to 140°C. for 3 to 5 minutes more. The base is now catalytic to the deposition of electroless metal on the surface of the base and on the walls in any holes in the base in which metal nuclei are exposed.

In still another manner of proceeding, a reducible metal salt composition, e.g., cupric formate, cupric gluconate, cupric acetate, cupric chloride, nickelous chloride, cobaltous chloride or ferrous sulfate in aqueous or non-aqueous solution, e.g., water, dimethyl formamide, ethyl acetate, trichloroethane, n-butanol, methanol, and the like, containing a surface active agent and containing an auxiliary reducing agent such as glycerine, is dip-coated onto the base, dried and exposed to a chemical reducing agent, e.g., an alkali metal borohydride, e.g., sodium or potassium borohydride, an alkali metal hydrosulfile, e.g., sodium hydrosulfite, or an amine borane, e.g., dimethylamine borane or morpholine borane in an aqueous or non-aqueous solvent, e.g., water or methanol, for about 1 to 2 min. or until the formation of reduced metallic nuclei is complete. After the base is rinsed free of chemical reagents, e.g., with water, the base is catalytic to the deposition of electroless metal on the surface of the base and on the walls in any holes in the base in which the reduced metal nuclei are arranged.

In more detail, in such a chemical reduction process, the base, if necessary will be cleaned and roughened by methods to be described later. The base is then dip-coated into one of the metal salt solutions, to be described, for a short time, e.g., 1–5 minutes and allowed to dry. The drying rate is not critical but it is dependent on the method of drying and the temperature used. Temperatures about 170°C. are not preferred, however. In non-aqueous systems, the drying rate can be regulated by the type of solvent system used. For example, 1,1,1-trichloroethane and ethyl acetate dry rapidly in air and thus require little or no heat for quick and complete drying.

The base having a layer of the dry metal salt thereon is next immersed into a chemical reducing solution, of the type to be described, for about 1–2 minutes or until the base is substantially darkened in color. This indicates that the metal salt has been reduced to free metal nuclei, e.g., copper. These portions of the substrate are now catalytic to the deposition of electroless metal.

The base is then rinsed in running water for a short time, e.g., 3–5 minutes. Finally, the base is immersed into an electroless metal bath for the deposition of metal and, if desired, a galvanic metal deposit is finally put down as a top layer. In all cases, metal accelerators described above will enhance the rates of image formation.

Typically, the autocatalytic or electroless metal deposition solutions for use in depositing electroless metal on the bodies having a layer of catalytic metal nuclei prepared as described herein comprise an aqueous solution of a water soluble salt of the metal or metals to be deposited, a reducing agent for the metal cations, and a complexing or sequestering agent for the metal cations. The function of the complexing or sequestering agent is to form a water soluble complex with the dissolved metallic cations so as to maintain the metal in solution. The function of the reducing agent is to reduce the metal cation to metal at the appropriate time.

Typical of such solutions are electroless copper, nickel, cobalt, silver, gold, tin, rhodium and zinc solutions. Such solutions are well known in the art and are capable of autocatalytically depositing the identified metals without the use of electricity.

Typical of the electroless copper solutions which may be used are those described in U.S. Pat. No. 3,095,309, the description of which is incorporated herein by reference. Conventionally, such solutions comprise a source of cupric ions, e.g., copper sulfate, a reducing agent for cupric ions, e.g., formaldehyde, a complexing agent for cupric ions, e.g., tetrasodium ethylenediamine-tetraacetic acid, and a pH adjustor, e.g., sodium hydroxide.

Typical electroless nickel baths which may be used are described in Brenner, Metal Finishing, Nov. 1954, pages 68 to 76, incorporated herein by reference. They comprise aqueous solutions of a nickel salt, such as nickel chloride, an active chemical reducing agent for the nickel salt, such as the hypophosphite ion, and a complexing agent, such as carboxylic acids and salts thereof.

Electroless gold plating baths which may be used are disclosed in U.S. Pat. No. 2,976,181, hereby incorporated herein by reference. They contain a slightly water soluble gold salt, such as gold cyanide, a reducing agent for the gold salt, such as the hypophosphite ion, and a chelating or complexing agent, such as sodium or potassium cyanide. The hypophosphite ion may be introduced in the form of the acid or salts thereof, such as the sodium, calcium and the ammonium salts. The purpose of the complexing agent is to maintain a relatively small portion of the gold in solution as a water soluble gold complex, permitting a relatively large portion of the gold to remain out of solution as gold reserve. The pH of the bath will be about 13.5 or between about 13 and 14, and the ion ratio of hypophosphite radical to insoluble gold salt may be between about 0.33 and 10:1.

Typical electroless cobalt and electroless silver baths will be described in the Examples. Electroless tin, rhodium and zinc baths are known by those skilled in the art.

A specific example of an electroless copper deposition bath suitable for use will now be described:

| | Moles/liter |
|---|---|
| Copper sulfate | 0.03 |
| Sodium hydroxide | 0.125 |
| Sodium cyanide | 0.0004 |
| Formaldehyde | 0.08 |
| Tetrasodium ethylenediaminetetraacetate | 0.036 |
| Water | Remainder |

This bath is preferably operated at a temperature of about 55°C. and will deposit a coating of ductile electroless copper about 1 mil thick in about 51 hours.

Utilizing the electroless metal baths of the type described, very thin conducting metal films or layers will be laid down on the catalytic metal nuclei. Ordinarily, the metal films superimposed on the catalytic metal nuclei by electroless metal deposition will range from 0.1 to 7 mils in thickness, with metal films having a thickness of even less than 0.1 mil being a distinct possibility.

Among its embodiments, the present invention contemplates metallized substrates in which the electroless metal, e.g., copper, nickel, gold or the like, has been further built up by attaching an electrode to the electroless metal surface and electrolytically, i.e., galvanically depositing on it more of the same or different metal, e.g., copper, nickel, silver, gold, rhodium, tin, alloys thereof, and the like. Electroplating procedures are conventional and well known to those skilled in the art.

For example, a pyrophosphate copper bath is commercially available for operation at a pH of 8.1 to 8.4, a temperature of 50°C., and a current density of 50 amp./sq.ft. In addition, a suitable fluoborate copper bath is operated at a pH of 0.6 to 1.2, a temperature of 25°–50°C., and a current density of 25 to 70 amp. per sq.ft. and is comprised of:

copper fluoborate $Cu(BF_4)_2$ — 225 – 450 g./l.
fluoboric acid, $HBF_4$ — 2 – 15 g./l.
boric acid, $H_3BO_3$ — 12 – 15 g./l.

For printed circuit application, copper deposits for use as the basic conductor material are usually 0.001 to 0.003 in. thick.

Silver may be deposited galvanically from a cyanide bath operated at a pH of 11.5 to 12, a temperature of 25°–35°C., and a current density of 5–15 amp./sq.ft. An illustrative galvanic silver bath is comprised of:

silver cyanide, AgCN — 50 g./l.
potassium cyanide, KCN — 110 g./l.
potassium carbonate, $K_2CO_3$ — 45 g./l.
brighteners — Variable Gold may be deposited galvanically from an acid gold citrate bath at pH 5–7, a temperature of 45°–60°C., and a current density of 5–15 amp./sq.ft. An illustrative galvanic gold bath consists of:

Sodium gold cyanide, $NaAu(CN)_2$ — 20 - 30 g./l.
dibasic ammonium citrate
$(NH_4)_2C_6H_5O_7$ — 25 - 100 g./l.

Nickel can be galvanically deposited at pH 4.5 to 5.5, a temperature of 45°C., and a current density of 20 to 65 amp./sq.ft., the bath containing:

nickel sulfate, $NiSO_4 \cdot 6H_2O$ – 240 g./l.
nickel chloride, $NiCl_2 \cdot 6H_2O$ – 45 g./l.
boric acid, $H_3BO_3$ — 30 g./l.

Tin and rhodium and alloys can be galvanically deposited by procedures described in Schlabach et al, Printed and Integrated Circuitry, McGraw-Hill, New York, 1963, p. 146–148.

It is essential in carrying out the process of this invention to use a clean base -- otherwise adhesion, as measured by the work needed to peel the electroless metal from the base, will be non-existent. Ordinarily, this will require chemical cleaning and/or polarizing the surface of the base. With adsorbent substrates, e.g., glass cloth, fabrics paper and the like, no special pretreatment is required, but the surface must be clean.

If the base is a metal clad laminate, e.g., having holes drilled through or punched therein, conventional cleaning methods are used to remove all contaminants and loose particles. The surface should be "chemically clean," i.e., free of grease, and surface films. A simple test is to spray the surface with distilled water. If the surface is chemically clean, the water will form a smooth film. If not, the water will break into droplets.

A base can be made clean by scrubbing with pumice or the like to remove heavy soils; rinsing with water; and subsequently removing soiling due to organic substances with a suitable alkaline cleaning composition, e.g.:

| | |
|---|---|
| sodium isopropyl naphthalene sulfonate | 3 g./l. |
| sodium sulfate | 1 g./l. |
| sodium tripolyphosphate | 14 g./l. |
| sodium metasilicate | 5 g./l. |
| tetrasodium pyrophosphate | 27 g./l. |

This operation is desirably performed at 160°–180°F. The surfaces are exposed to the bath for 5 to 30 minutes. Other suitable alkali cleaning compositions, detergents and soaps may be used, taking care in the selection not to have the surface attacked by the cleaner. If present, surface oxides can be removed from metal surfaces with light etchants, such as 25% ammonium persulfate in water, or the cupric chloride etchant of U.S. Pat. No. 2,908,557. On the other hand, if the shape of the base permits, a sanding operation with fine abrasive can also be used to remove oxides.

Unclad resinous substrates, e.g., resinous, e.g., epoxy resins, impregnated fibrous structures and varnish, e.g., epoxy resin varnish, coated resin impregnated fiber structures are best provided with an additional surface treatment, e.g., the direct bonding pretreatment process of copending U.S. Ser. No. 72,582, filed Sept. 16, 1970, now U.S. Pat. No. 3,723,038 incorporated by reference, to achieve strong adhesion of electroless metal deposits to the base.

This generally comprises treating the base with a suitable organic or inorganic acid, e.g., chromic or sulfuric acid, or base solution to render it porous. In many cases it is desirable to also treat the surface with an agent, e.g., dimethyl formamide or dimethyl sulfoxide before or during the etching process. The effect of such treatment is to render the surface polar.

Depending upon the particular insulating bases involved, other ion exchange imparting materials may be utilized to effect the aforementioned temporary polarization reaction. For example, acidified sodium fluoride, hydrochloric and hydrofluoric acids, chromic acid, borates, fluoroborates and caustic soda, as well as mixtures thereof, have been found effective to polarize the various synthetic plastic resin insulating materials described herein.

In a typical procedure, after treatment with the polarizing agents, the insulating bodies are rinsed so as to eliminate any residual agent, following which they are immersed in a solution containing a wetting agent, the ions of which are base exchanged with the surface of the insulating base to thereby impart to the base relatively long chained ions which also are capable of chemically linking with precious metal ions or ionic complexes containing precious metal ions. Following treatment with the wetting agent, the insulating bodies are rinsed again so as to eliminate the residual wetting agent solution.

DESCRIPTION OF THE PREFERRED EMBODIMENTS

The following examples illustrate the methods and articles of this invention. They are not to be construed to limit the invention in any manner whatsoever.

EXAMPLE 1

A copper clad epoxy-glass laminate having holes drilled in it for through hole connection is cleaned with a hot alkaline cleaner of the type described above, and all loose particles are removed.

The clean laminate is dip coated for 1–2 minutes in a solution of the following formulation:

cupric formate — 10 g.
anthraquinone 2,6-disulfonic acid disodium salt — 2 g.
water — 100 g.
glycerine — 1 g.

The coated substrate is placed in an oven for 10–20 minutes at 130°–140°C. to reduce the layer of copper salt composition to a layer of copper nuclei.

The darkened substrate is removed from the oven and allowed to cool.

An electroless copper layer is deposited on the layer of copper nuclei on the catalytic substrate by immersing it in a bath at 55°C., the bath having the following composition:

cupric sulfate — 0.03 moles/l.
sodium hydroxide — 0.125 moles/l.

sodium cyanide — 0.0004 moles/l.
formaldehyde — 0.08 moles/l.
tetrasodium ethylenediamine
tetraacetate — 0.036 moles/l.
water — Remainder The surface of the base and the walls of the holes in the base are covered with a firmly adherent layer of bright, ductile electrolessly deposited copper.

EXAMPLE 2

The procedure of Example 1 is repeated, substituting for the copper clad laminate base, an unclad epoxy impregnated glass fiber laminate (Westinghouse M-6528). The base is activated as follows:

a. Treat the surface of the base by dipping in dimethyl formamide (DMF, sp.gr. 0.947–0.960 at 24°C.) for 5 minutes, and drain for 15 seconds.
b. Solvent rinse the base in 9 parts by volume, of ethyl acetate and 1 part by volume DMF (sp.gr. 0.900 to 0.922 at 24°C.) with occasional rack agitation to clear the holes for 30 seconds, and then drain for 15 seconds.
c. Repeat step (b) in a second solvent rinse tank, drain 15 seconds, then allow parts on rack load to air dry for 2 minutes.
c. Treat the base in a bath comprising:
$CrO_3$ — 80–100 g./l.
Conc. $H_2SO_4$ — 200–250 ml./l.
Fluorocarbon wetting agent
(3-M Company, FC-95) — 0.5 g./l.
at 40°–45°C. with gentle agitation of the solution for 5 minutes and drain for 15 seconds.
e. Neutralize the base with potassium bisulfite solution for 1–2 minutes.
f. Rinse the polarized base for 5 minutes.

The activated base is sensitized and an electroless copper layer is deposited thereon by the procedure of Example 1.

EXAMPLES 3 and 4

The procedure of Example 1 is repeated, substituting an activated epoxy glass laminate as the base (Example 2) and metal salt baths of the following compositions:

(EXAMPLE 3)

cupric formate — 10 g.
dimethyl formamide — 100 ml.
anthraquinone 2,6-disulfonic
acid disodium salt — 6 g.
wetting agent (Rohm and Haas,
Triton X-100) — 1 g.

(EXAMPLE 4)

cupric formate — 10 g.
water — 100 ml.
glycerine — 6 g.
surface active agent
(Triton X-100) — 1 g.

There are obtained electrolessly metallized bases according to this invention.

EXAMPLE 5

A clean epoxy-glass laminate polarized according to the procedure of Example 2 is dip coated for 1–5 minutes into a metal salt solution of the following formulation:

cupric gluconate — 12.5 g.
surface active agent
(Triton X-100) — 0.2 g.
glycerine (optional) — 70.0 g.
citric acid — 70.0 g.
water (to make) — 1 liter The substrate is allowed to dry thoroughly, heating if necessary, but not above 170°C.

The dry metallic compound coated substrate is immersed for 1–2 minutes into a reducing solution of the formulation:

sodium borohydride — 10 g.
water (to make) — 1000 ml.

The substrate, the surface of which has substantially darkened in color due to the deposition of a layer of metallic copper nuclei, is rinsed in running water for 3–5 minutes.

The sensitized substrate is then coated with a layer of electroless copper by immersing it into an electroless plating bath as described in Example 1.

EXAMPLES 6 - 14

The procedure of Example 5 is repeated, substituting for the cupric gluconate salt solution, the following:

(EXAMPLE 6)

cupric acetate — 4.0 g.
surface active agent
(Triton X-100) — 0.8 g.
citric acid — 20.0 g.
glycerine (optional) — 40.0 g.
water (to make) — 500.0 ml.

(EXAMPLE 7)

cupric acetate — 5 g.
ethyl acetate (to make) — 1 liter (EXAMPLE 8)

cupric chloride — 2.0 g.
methanol (to make) — 1 liter (EXAMPLE 9)

cupric acetate — 1.0 g.
ethyl acetate — 200 ml.
1,1,1-trichloroethylene — 800 g.

(EXAMPLE 10)

cupric acetate — 4.0 g.
surface active agent
(Triton X-100) — 0.8 g.
water (to make) 500 ml.

(EXAMPLE 11)

nickelous chloride — 14 g.
water — 700 ml.

(EXAMPLE 12)

cobaltous chloride — 14 g.
water — 700 ml.

(EXAMPLE 13)

ferrous sulfate — 30 g.
water — 1000 ml.
sulfuric acid (to pH 2.0)

(EXAMPLE 14)

ferrous sulfate — 30 g.
methanol — 1000 ml.

The metal salts on the dry, coated substrates are reducted to metallic nuclei with the sodium borohydride solution and an electroless copper layer is deposited thereon by the procedure of Example 1. It is to be noted that, in addition to copper metal nuclei, there are employed nickel (Example 11), cobalt (Example 12) and iron (Examples 13 and 14) nuclei.

EXAMPLES 15 - 17

The procedure of Example 5 is repeated, substituting the following reducing solutions for sodium borohydride in water:

(EXAMPLE 15)

sodium borohydride — 7.5 g.
water (to make) — 1000 ml.
sodium hydroxide (to pH 13)

(EXAMPLE 16)

sodium borohydride — 10 g.
dimethyl formamide — 1000 ml.

(EXAMPLE 17)

dimethylamine borane — 20 g.
sodium hydroxide — 38 g.
water (to make) — 1000 ml.

In all cases copper metallized substrates according to this invention are obtained.

EXAMPLE 18

The procedure of Example 5 is repeated, substituting for the cupric gluconate solution, the following solution:

cupric acetate — 1.3 g.
ferric ammonium sulfate — 3.5 g.
pentaerythritol — 20 g.
glycerol — 16 g.
citric acid — 10 g.
Sufactant 6G
(Rohm & Haas Co.) — 0.3 g.
water (to make) — 1000 ml.

A visible deposit of metallic nuclei is formed after a two minute exposure to the following solution:

dimethylamine borane — 1 g.
sodium hydroxide — 37 g.
water (to make) — 1000 ml.

Substrates metallized in accordance with this invention are obtained.

EXAMPLE 19

A clean polarized epoxy-glass laminate (Example 2) is dip coated into a metal salt solution of the formula:

cupric formate — 10 g.
anthraquinone 2,6-disulfonic
acid disodium salt — 2 g.
water — 1000 ml.
glycerine — 10 g.

and allowed to dry at 50°-60°C. for 5 minutes.

The substrate is exposed to ultraviolet light for 1 to 2 minutes, forming a layer of copper nuclei. The substrate is heated for 3 to 5 minutes at 130° to 140°C. A layer of copper is built up in the nuclei by electrolessly depositing copper onto the substrate from a bath as described in Example 1.

Instead of a resinous body, paper or a woven fabric can be used.

Flexible printed circuits are made by this method as follows:

a. treat a bibulous paper or flexible plastic film substrate with the metal salt solution;
b. dry for 5 to 10 minutes at 60°C.;
expose the dry coating through a negative to an ultraviolet light source;
d. develop or remove the unexposed metal salts under a warm water rinse;
e. immerse the treated paper or plastic film into an electroless copper solution and plate up to the desired thickness of metal;
f. neutralize the treated paper or film, wash and dry; and
g. coat the treated paper or film with a polymerizable resin and polymerize the resin.

EXAMPLES 20 - 23

The procedure of Example 19 is repeated (without heating) substituting the following reducible salt solutions:

(EXAMPLE 20)

cupric formate — 10 g.
anthraquinone 2,6-disulfonic
acid disodium salt — 3 g.
water — 450 ml.
glycerine — 30 ml.
citric acid — 30 g.
stannous chloride — 1 g.
fluorocarbon wetting agent
(3-M Co., FC-170) — 0.25 g.

(EXAMPLE 21)

Prepare Part A:
cupric gluconate — 15 g.
water — 200 g.
Prepare Part B:
fluorocarbon wetting agent
(FC-170) — 0.1 g.
glycerine — 30 g.
citric acid — 30 g.
anthraquinone 2,6-disulfonic
acid disodium salt — 2 g.
stannous chloride — 1 g.
water — 250 g.
Mix A and B.

(EXAMPLES 22 AND 23)

Prepare Part A:

| | | |
|---|---|---|
| cupric acetate | 15 g. | |
| cupric nitrate | | 15 g. |
| water | 200 g. | 200 g. |

Prepare Part B:

| | | |
|---|---|---|
| wetting agent (FC-170) | 0.25 g. | 0.25 g. |
| glycerine | 30 g. | 30 g. |
| citric acid | 30 g. | 30 g. |
| anthraquinone 2,6-disulfonic acid disodium salt | 3 g. | 3 g. |
| water | 250 g. | 250 g. |
| stannous chloride | 1 g. | 1 g. |

EXAMPLES 24 and 25

The procedure of Example 19 is repeated, substituting for the cupric formate solution, the following solution using ferric ammonium sulfate as the sensitizer:

(EXAMPLE 24)

cupric acetate — 1.3 g.
ferric ammonium sulfate — 3.5 g.
pentaerythritol — 20 g.
glycerol — 16 g.
citric acid — 10 g.
Surfactant 6G
(Rohm & Hass Co.) — 0.3 g.
water (to make) — 1000 ml.

A visible deposit of metallic nuclei is formed after a two minute exposure to ultraviolet light. If desired, the deposit can be intensified by further contact with the following solution:

dimethylamine borane — 1 g.
sodium hydroxide — 37 g.
water (to make) — 1000 ml.

The procedure is repeated, substituting the following solution using L-ascorbic acid as the sensitizer:

(EXAMPLE 25)

cupric acetate — 4 g.
L-ascorbic acid — 5 g.
pentaerythritol — 25 g.
sorbitol — 30 g.
citric acid — 20 g.
stannous chloride — 0.5 g.
Surfactant 6G
(Rohm & Haas Co.) — 0.5 g.
water (to make) — 1000 ml.

In all cases, substrates metallized according to this invention are obtained.

(EXAMPLE 26)

The following process uses a metal salt composition which includes a metal accelerator.

A base polarized by the procedure of Example 2 is dipped for 2 minutes in a solution comprising:

cupric nitrate ($Cu(NO_3)_2$ 19% $H_2O$) – 3 g.
palladium chloride* — 25mg.
methanol (to make) — 1000ml.

*Pd $Cl_2$ is added as a solution concentrate in HCl.

The base is air dried then dipped for two minutes in a reducing solution of 1 g/l of sodium borohydride in water. The base is rinsed for two to five minutes in overflow water and metallized by the procedure of Example 1. The following metal accelerators can be substituted for Pd $Cl_2$ at 0.4 g./l.: Ni $SO_4 \cdot 6H_2O$; Fe $SO_4 \cdot 7H_2O$; $Co(C_2H_3O_2)_2 \cdot 4H_2O$.

EXAMPLES 27–30

The procedure of Examples 1, 5 and 19 are repeated, substituting for the electroless copper solution, an electroless nickel solution:

(EXAMPLE 27)

nickel chloride — 30 g.
sodium hypophosphite — 10 g.
glycollic acid — 25 g.
sodium hydroxide — 12.5 g.
water — 1000 ml.

The pH is adjusted to 4.5 and the bath temperature is maintained at 95°C. A nickel layer is built up on the copper nuclei.

The procedure of Examples 1, 5 and 19 are repeated, substituting for the electroless copper solution, an electroless cobalt solution:

(EXAMPLE 28)

cobalt chloride — 30 g.
sodium hypophosphite — 20 g.
sodium citrate dihydrate — 29 g.
ammonium chloride — 50 g.
water (to make) — 1000 ml.

The pH is adjusted to 9.5 and the bath temperature is maintained at 90°C. A cobalt layer is built up on the copper nuclei.

The procedure of Examples 1, 5 and 19 is repeated, substituting for the electroless copper solution, an electroless gold solution:

(EXAMPLE 29)

gold chloride hydrochloride
trihydrate — 0.01 mole/l.
sodium potassium tartrate — 0.014 mole/l.
dimethyl amine borane — 0.013 mole/l.
sodium cyanide — 0.4 mole/l.
water — q.s.a.d.

The pH is adjusted to 13 and the bath temperature is maintained at 60°C. A gold layer is built up on the copper nuclei.

The procedure of Examples 1, 5 and 19 is repeated, substituting for the electroless copper solution, an electroless silver solution:

(EXAMPLE 30)

silver nitrate — 1.7 g.
sodium potassium tartrate — 4 g.
sodium cyanide — 1.8 g.
dimethyl amine borane — 0.8 g.
water (to make) — 1000 ml.

The pH is adjusted to 13 and the bath temperature is maintained at 80°C. A silver layer is built up on the copper nuclei.

The non-conductive layers of nickel, cobalt and iron nuclei prepared as described above can also be built up as described for the copper nuclei in these examples with electroless nickel, cobalt, gold and silver.

All such metallized substrates having a layer of electroless metal on top of the nuclei can further be built up with an electroplated layer of copper, silver, gold, nickel, cobalt, tin, rhodium and alloys thereof, using the baths and conditions described hereinabove.

The above disclosure demonstrates that the present process provides for the reduction of a layer of metal salt to a layer of metallic nuclei by means of radiant energy such as heat or light or by chemical reduction. The layer of nuclei has been shown to be catalytic to adherent electroless metal deposition and this metal can be further built up in thickness with electroplated metal.

The above teachings disclose means to use the instant invention in the preparation of printed circuit boards. Other methods specifically useful are as follows:

EXAMPLE 31

This procedure produces a printed circuit by photoprinting a negatively masked substrate coated with a reducible metal salt composition according to this invention and building up the conductive pattern electrolessly.

A resinous laminated base is polarized according to Example 2. Holes are provided in the base at preselected cross over points. The base is coated with a metal salt solution of the following formulation:

cupric acetate — 8 g.
anthraquinone 2,6-disulfonic acid
disodium salt — 16 g.
pentaerythritol — 50 g.
sorbitol — 60 g.
citric acid — 40 g.
stannous chloride — 0.5 g.
surfactant 6G (Rohm and Haas) — 1 g.

The base is allowed to dry at 50°–60°C. for 5 minutes.

The upper surface of the base is then covered with a negative mask having a negative image of the desired surface pattern. The dry coating is exposed through the negative to an ultraviolet light source for 2 minutes. Ultraviolet light is also directed down into the hole walls. The negative is removed and the unexposed metal salts are removed with a warm water rinse. The base is then exposed to an electroless copper solution (as described in Example 1), and electroless copper is deposited on the walls surrounding the holes and also on the areas of the upper metal film which were not covered by the mask, thereby imposing a circuit pattern on the top surface of the base.

Next, if desired, the base can be connected as an electrode in an electrolytic metal deposition solution to deposit additional metal on the walls surrounding the holes and also to build up the circuit pattern.

Alternatively, the circuit pattern can be produced by coating the base with the salt solution of Example 5, reducing with the sodium borohydride, applying a negative mask to define the circuit pattern, electrolessly building up the conductor pattern and the hole walls and finally stripping off the mask to produce the completed printed circuit.

EXAMPLE 32

This procedure produces a printed circuit by positive printing on the base.

A chemically clean laminate base is silk-screen printed with a circuit pattern, using the following composition as the "ink":

cupric formate — 10 g.
anthraquinone 2,6-disulfonic
acid disodium salt — 2 g.
glycerol — 10 g.
hydroxy methyl cellulose — 10 g.
water — 500 ml.

The base is dried at 55°–60°C. for 5 minutes, then exposed to ultraviolet light for 2 minutes, forming a pattern of copper nuclei corresponding to the circuit pattern. The pattrn is built up by electrolessly depositing copper onto the nuclei from a bath as described in Example 1.

EXAMPLE 33

The procedure of Example 31 is repeated, except that a thin electroless film only is deposited on the patterned nuclei. The base is then connected in an electrolytic copper deposition solution and the circuit pattern is built up electrolytically to the desired thickness.

EXAMPLE 34

A resinous insulating base is provided with a uniform layer of an adhesive by dip coating in the following composition:

acrylonitrile-butadiene copolymer
(Paracryl CV, manufactured by
Naugatuck Chemical Div.) — 72 g.
phenolic resin
(SP-8014, manufactured by
Schnectady Chemical Co.) — 14 g.
methyl ethyl ketone — 1200 g.

The adhesive coated base is heated until cured, treated with a chromic-sulfonic solution then dipped into a metal salt composition of the following formulation:

cupric acetate — 8 g.
anthraquinone 2,6-disulfinic acid
disodium salt — 16 g.
pentaerythritol — 50 g.
sorbitol — 60 g.
citric acid — 40 g.
stannous chloride — 0.5 g.
surfactant 6G (Rohm and Haas) — 1 g.

The base is dried at 55°–60°C for 5 minutes, then exposed to ultraviolet light for two minutes, forming a layer of copper nuclei on the adhesive layer. The lower surface of the base is covered with a resinous mask and a negative image of the desired surface pattern is printed on the top surface of the base. The base is then exposed to an electroless copper solution (as described in Example 1), and electroless copper is deposited on the areas of the upper surface not covered by the mask, thereby imposing a circuit pattern on the top surface of the base.

Next, if desired, the base can be connected as an electrode in an electrolytic metal deposition solution to deposit additional metal to build up the circuit pattern.

When the pattern has been built up to the desired thickness, the base is treated with a solvent to strip off the mask. If desired, the copper nuclei previously covered by the mask can be stripped off with a quick etch to produce the completed printed circuit.

Substrates can include epoxy glass laminates, polyester film, ceramics, paper and the like. The polarization treatment described above provides a very active surface to which the metal salt strongly adsorbs and ultimately there is formed a strong bond between the base and the electrolessly deposited metal.

The invention in its broader aspects is not limited by the specific steps, methods, compositions and improvements shown and described herein, and departures may be made within the scope of the accompanying claims without departing from the principles thereof.

We claim:

1. In a process for producing metallized articles by contacting a base sensitized to the reception of a electroless metal with an electroless metal deposition solution, the steps which comprise depositing on said base a layer of radiation-sensitive composition by treating said base with a solution comprising a reducible salt of a non-noble metal, a radiation-sensitive reducing agent for said salt and a secondary reducer in an acid-containing liquid medium, and exposing said layer to radiant energy to reduce said metal salt to metallic nuclei thereby producing a non-conducting layer on said base of said metallic nuclei capable of directly catalyzing the deposition on said nuclei of metal from an electroless metal bath.

2. A process as defined in claim 1 wherein said base is a porous material.

3. A process as defined in claim 1 wherein said base is a non-metallic resinous base with a polarized surface.

4. A process as defined in claim 1 wherein said base is a metal clad insulating base.

5. A process as defined in claim 1 wherein said metal salt is reduced to metallic nuclei by exposure to light.

6. A process as defined in claim 1 wherein said metal salt is reduced by exposure to ultraviolet light.

7. A process as defined in claim 1 wherein said salt is of the group consisting of reducible salts of copper, nickel, cobalt and iron.

8. A process as defined in claim 1 wherein said radiation-sensitive composition also includes a metal accelerator.

9. A process as defined in claim 1 wherein said reducing agent is a light-sensitive reducing compound of the group consisting of ferric salts, dichromates, anthraquinone disulfonic acids and salts, glycine and L-ascorbic acid.

10. A process as defined in claim 9 wherein said secondary reducer is a polyhydroxy alcohol.

11. A process as defined in claim 10 wherein said composition also includes a metal accelerator.

12. A process as defined in claim 1 wherein said radiation-sensitive reducing agent comprises anthraquinone 2,6-disulfonic acid disodium salt.

13. A process as defined in claim 12 wherein said composition also comprises stannous chloride as a metal accelerator.

14. A process as defined in claim 13 wherein said liquid medium also contains citric acid and a polyhydroxy alcohol secondary reducer of the group consisting of glycerine, sorbitol, pentaerythritol and mesoerythritol.

15. A process as defined in claim 1 wherein said base is thereafter exposed to an electroless metal bath to build up a layer of said electroless metal on said layer of metallic nuclei.

16. A process as defined in claim 15 wherein the treated base is dried before the exposure to radiant energy, and said base is rinsed after said exposure to radiant energy and prior to the exposure to said electroless metal bath.

17. A process as defined in claim 15 wherein said electroless metal is of the group consisting of copper, nickel, cobalt, silver, gold, tin, rhodium and zinc.

18. A process as defined in claim 15 wherein said salt is of the group consisting of reducible salts of copper, nickel, cobalt and iron, and said electroless metal is of the group consisting of copper, nickel, cobalt, silver, gold, tin, rhodium and zinc.

19. A process as defined in claim 15 wherein said salt is a reducible copper salt and said electroless metal is copper.

20. An article which comprises a base bearing a layer of a radiation-sensitive composition comprising a reducible salt of a non-noble metal, a radiation-sensitive reducing agent for said salt, a secondary reducer and an acid.

21. An article as defined in claim 20 wherein said base is a porous material.

22. An article as defined in claim 20 in which said base is a non-metallic resinous base having a polarized surface underlying said layer of radiation-sensitive composition.

23. An article as defined in claim 20 wherein said base is a metal clad, non-metallic base.

24. An article as defined in claim 20 wherein said reducing agent is a light-sensitive reducing compound of the group consisting of ferric salts, dichromates, anthraquinone disulfonic acids and salts, glycine and L-ascorbic acid.

25. An article as defined in claim 20 wherein said salt is of the group consisting of reducible salts of copper, nickel, cobalt and iron, and said reducing agent is a light-sensitive reducing compound of the group consisting of ferric salts, dichromates, anthraquinone disulfonic acids and salts, glycine and L-ascorbic acid.

26. An article as defined in claim 20 wherein said radiation-sensitive composition comprises a reducible copper salt, anthraquinone 2,6-disulfonic acid disodium salt as said radiation-sensitive, reducing agent, stannous chloride as a metal accelerator, citric acid and a secondary reducer of the group consisting of glycerine, sorbitol, pentaerythritol and mesoerythritol.

27. An article as defined in claim 20 wherein said secondary reducer is a polyhydroxy alcohol.

28. An article as defined in claim 27 wherein said radiation-sensitive composition also includes a metal accelerator.

29. An article as defined in claim 20 wherein said metal salt is of the group consisting of reducible salts of copper, nickel, cobalt, iron and mixtures thereof capable of reduction to a non-conductive layer of nuclei of said metal and capable of catalyzing the deposition of electroless metal from an electroless metal deposition solution in contact with said nuclei.

30. An article as defined in claim 29 wherein said radiation-sensitive composition is sensitive to radiant energy of the group consisting of heat, light, X-rays and electron beams.

31. An article as defined in claim 29 wherein said electroless metal is of the group consisting of copper, nickel, cobalt, silver, gold, tin, rhodium and zinc.

32. A process as defined in claim 31 wherein said metal salt is a copper salt and said electroless metal is copper.

* * * * *

UNITED STATES PATENT AND TRADEMARK OFFICE

Certificate

Patent No. 3,772,056 Patented November 13, 1973

Joseph Polichette, Edward J. Leech and Francis J. Nuzzi

Application having been made by Joseph Polichette, Edward J. Leech and Francis J. Nuzzi, the inventors named in the patent above identified, and Photo-circuits Division of Kollmorgen Corporation, Hartford, Connecticut, the assignee for the issuance of a certificate under the provisions of Title 35, Section 256, of the United States Code, deleting the name of Francis J. Nuzzi as a joint inventor, and a showing and proof of facts satisfying the requirements of the said section having been submitted, it is this 15th day of July 1975, certified that the name of the said Francis J. Nuzzi is hereby deleted to the said patent as a joint inventor with the said Joseph Polichette and Edward J. Leech.

FRED W. SHERLING,
*Associate Solicitor.*